(12) United States Patent
Jeong et al.

(10) Patent No.: US 11,482,980 B2
(45) Date of Patent: Oct. 25, 2022

(54) CURRENT FILTER EXTERNALLY COUPLED TO CABLE

(71) Applicant: AGENCY FOR DEFENSE DEVELOPMENT, Daejeon (KR)

(72) Inventors: Kil Soo Jeong, Daejeon (KR); Jeong Seop Kim, Daejeon (KR); Ju Hang Sohn, Daejeon (KR); Dong Hyeok Lee, Daejeon (KR); Chang Gyun Kim, Seoul (KR); Soung Hwan Chi, Seoul (KR); Heejae Jun, Seoul (KR); Yong Woo Park, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 21 days.

(21) Appl. No.: 17/179,408

(22) Filed: Feb. 19, 2021

(65) Prior Publication Data

US 2022/0131515 A1 Apr. 28, 2022

(30) Foreign Application Priority Data

Oct. 26, 2020 (KR) .................. 10-2020-0139748

(51) Int. Cl.
*H03H 7/01* (2006.01)
*H01P 1/202* (2006.01)
*H02G 3/22* (2006.01)

(52) U.S. Cl.
CPC ............ *H03H 7/0138* (2013.01); *H01P 1/202* (2013.01); *H02G 3/22* (2013.01); *H03H 7/0115* (2013.01)

(58) Field of Classification Search
CPC ...... H01P 1/202; H03H 7/0138; H03H 7/0115
USPC .................................................. 333/202, 208
See application file for complete search history.

(56) References Cited

U.S. PATENT DOCUMENTS

| | | | |
|---|---|---|---|
| 5,493,068 A | 2/1996 | Klein et al. | |
| 2003/0218521 A1* | 11/2003 | Andoh | H01P 1/202 333/206 |
| 2015/0288233 A1 | 10/2015 | Kim et al. | |

FOREIGN PATENT DOCUMENTS

| | | |
|---|---|---|
| JP | 6-205527 | 7/1994 |
| KR | 10-1609635 | 4/2016 |

* cited by examiner

*Primary Examiner* — Rakesh B Patel
(74) *Attorney, Agent, or Firm* — Ladas & Parry, LLP (57) ABSTRACT

A current filter externally coupled to a cable includes a coupling portion coupled to a cable portion to surround the cable portion including at least one cable, the coupling portion including a flexible metal, and a ground portion detachably attached to the coupling portion and transmitting a current flowing through the coupling portion to a ground plane.

11 Claims, 7 Drawing Sheets

CURRENT FILTER EXTERNALLY COUPLED TO CABLE

CROSS-REFERENCE TO RELATED APPLICATION

This application is based on and claims priority under 35 U.S.C. § 119 to Korean Patent Application No. 10-2020-0139748, filed on Oct. 26, 2020, in the Korean Intellectual Property Office, the disclosure of which is incorporated by reference herein in its entirety.

BACKGROUND

1. Field

One or more embodiments relate to a current filter externally coupled to a cable to reduce the influence of external electromagnetic waves on the cable.

2. Description of Related Art

High-altitude electromagnetic pulses (HEMPs) refer to electromagnetic pulses generated by a high-altitude nuclear explosion. In recent years, interest in HEMP protection facilities that can defend against HEMPs is increasing due to a nuclear threat caused by North Korea's nuclear development. The evaluation of these protection facilities is done through evaluation by electromagnetic shielding effectiveness (SE) and pulsed current injection (PCI) testing, and the contents thereof are specified in MIL-STD-188-125-1 which is the HEMP protection standard applied domestically and internationally.

In order to block a general external signal, a shield that covers the outside of a cable and is grounded, and a filter connected to a signal line are used. However, electromagnetic pulses (EMPs) or HEMPs have very strong energy, and this strong energy transfers energy exceeding the shielding performance of general shields and filters to the cable, and thus the protection system may be disabled. In addition, in the case of an internal filter, there is a problem in that the internal filter does not function properly when a received signal and an external noise signal have the same frequency.

In addition, when a standard or design target is given, it is difficult to change the internal filter and an external cable shield, and thus, it is difficult to efficiently cope with EMPs with energy spread out in a wide frequency range. In addition, the thickness of the shield and the mounting position of the filter are fixed, and it is impossible to move the mounting position or change the thickness as necessary.

SUMMARY

One or more embodiments include a current filter externally coupled to a cable, the current filter being capable of improving protection from electromagnetic pulses (EMPs) (e.g., high-altitude electromagnetic pulses (HEMPs)) by inducing a current induced in a cable to flow to a ground plane by using a single capacitive coupling cylinder and being capable of simplifying installation, manufacturing, and maintenance.

Additional aspects will be set forth in part in the description which follows and, in part, will be apparent from the description, or may be learned by practice of the presented embodiments of the disclosure.

According to one or more embodiments, a current filter externally coupled with a cable includes a coupling portion coupled to a cable portion to surround the cable portion including at least one cable, the coupling portion including a flexible metal, and a ground portion detachably attached to the coupling portion and transmitting a current flowing through the coupling portion to a ground plane.

The coupling portion may have a first end on one side and a second end on the other side, the second end facing the first end, and the ground portion may include at least two ground rods, wherein the at least two ground rods may include a first ground rod connected to the first end and a second ground rod spaced apart from the first ground rod and connected to the second end.

The first ground rod may include a first coupling terminal coupled to the first end and a first ground terminal connected to the ground plane, and the second ground rod may include a second coupling terminal coupled to the second end and a second ground terminal connected to the ground plane, wherein the ground portion may be detachably attached to the coupling portion through the first coupling terminal and the second coupling terminal, and may transmit current induced in the coupling portion to the ground plane through the first ground terminal and the second ground terminal.

The coupling portion may make a capacitive coupling with a metal shield surrounding a transmission line included in the cable portion.

The current filter may further include a locking device attached to the coupling portion to fix the coupling portion to the cable portion.

The coupling portion may have a cylindrical shape having a length extending in a first direction, wherein a diameter of a first cross-section taken by cutting the coupling portion in a second direction crossing the first direction may be adjusted using the locking device.

According to one or more embodiments, a current filter externally coupled with a cable includes a coupling portion coupled to a cable portion to surround the cable portion including at least one cable, the coupling portion including a flexible metal, and a ground portion detachably attached to the coupling portion and transmitting a current flowing through the coupling portion to a ground plane, wherein the ground portion includes a ground plate in contact with at least a portion of the coupling portion, and a plurality of ground pins connected to the ground plate.

Each of the plurality of ground pins may include a coupling terminal coupled to the ground plate and a ground terminal coupled to the ground plane, wherein the ground portion may be detachably attached to the coupling portion through the coupling terminal and may transmit current induced in the coupling portion to the ground plane through the ground terminal.

The current filter may further include a locking device attached to the coupling portion to fix the coupling portion to the cable portion, wherein a size of the coupling portion when the coupling portion is coupled to the cable portion may be adjusted using the locking device.

According to one or more embodiments, a current filter externally coupled with a cable includes a coupling portion coupled to a cable portion to surround the cable portion including at least one cable, the coupling portion including a flexible metal, and a ground portion detachably attached to the coupling portion and transmitting a current flowing through the coupling portion to a ground plane, wherein the ground portion includes a ground plate in contact with at least a portion of the coupling portion, wherein the ground plate has a mesh shape.

The ground plate may include a first surface in contact with at least a portion of the coupling portion, and a second surface opposite to the first surface and connected to the ground plane, wherein the ground portion may be detachably attached to the coupling portion through the first surface and may transmit current induced in the coupling portion to the ground plane through the second surface.

The current filter may further include a locking device attached to the coupling portion to fix the coupling portion to the cable portion, wherein a size of the coupling portion when the coupling portion is coupled to the cable portion may be adjusted using the locking device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

Hereinafter, the present embodiments are described in detail with reference to the accompanying drawings. In the drawings, the same reference numerals are given to the same or corresponding elements, and repeated description thereof is omitted.

It will be understood that although terms such as "first" and "second" may be used herein to describe various components, these components should not be limited by these terms and these terms are only used to distinguish one component from another component. Also, as used herein, the singular forms "a," "an," and "the" are intended to include the plural forms as well, unless the context clearly indicates otherwise. Also, it will be understood that the terms "comprise," "include," and "have" used herein specify the presence of stated features or components, but do not preclude the presence or addition of one or more other features or components. Sizes of components in the drawings may be exaggerated for convenience of description. In other words, because the sizes and thicknesses of components in the drawings are arbitrarily illustrated for convenience of description, the present disclosure is not limited thereto.

Also, it will be understood that when a layer, region, or component is referred to as being "connected" to another layer, region, or component, it may be "directly" or "indirectly" connected to the other layer, region, or component, that is, for example, one or more intervening layers, regions, or components may be located therebetween. For example, it will be understood that when a layer, region, or component is referred to as being "electrically connected" to another layer, region, or component, it may be "directly electrically" or "indirectly electrically" connected to the other layer, region, or component, that is, for example, one or more intervening layers, regions, or components may be located therebetween.

Figure 1:
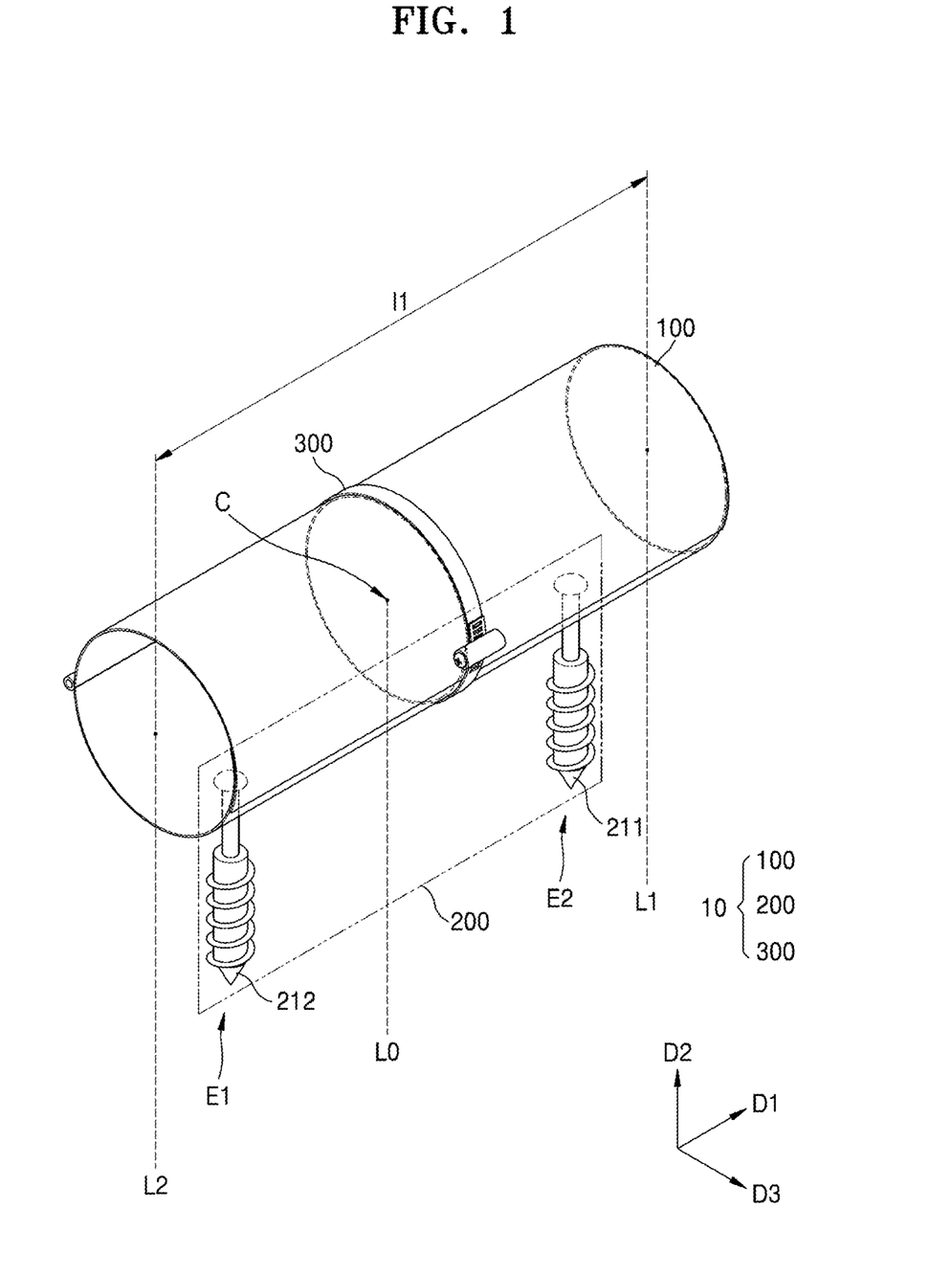
FIG. 1 is a perspective view illustrating a configuration of a current filter externally coupled to a cable, according to an embodiment of the disclosure.
Figure 2:
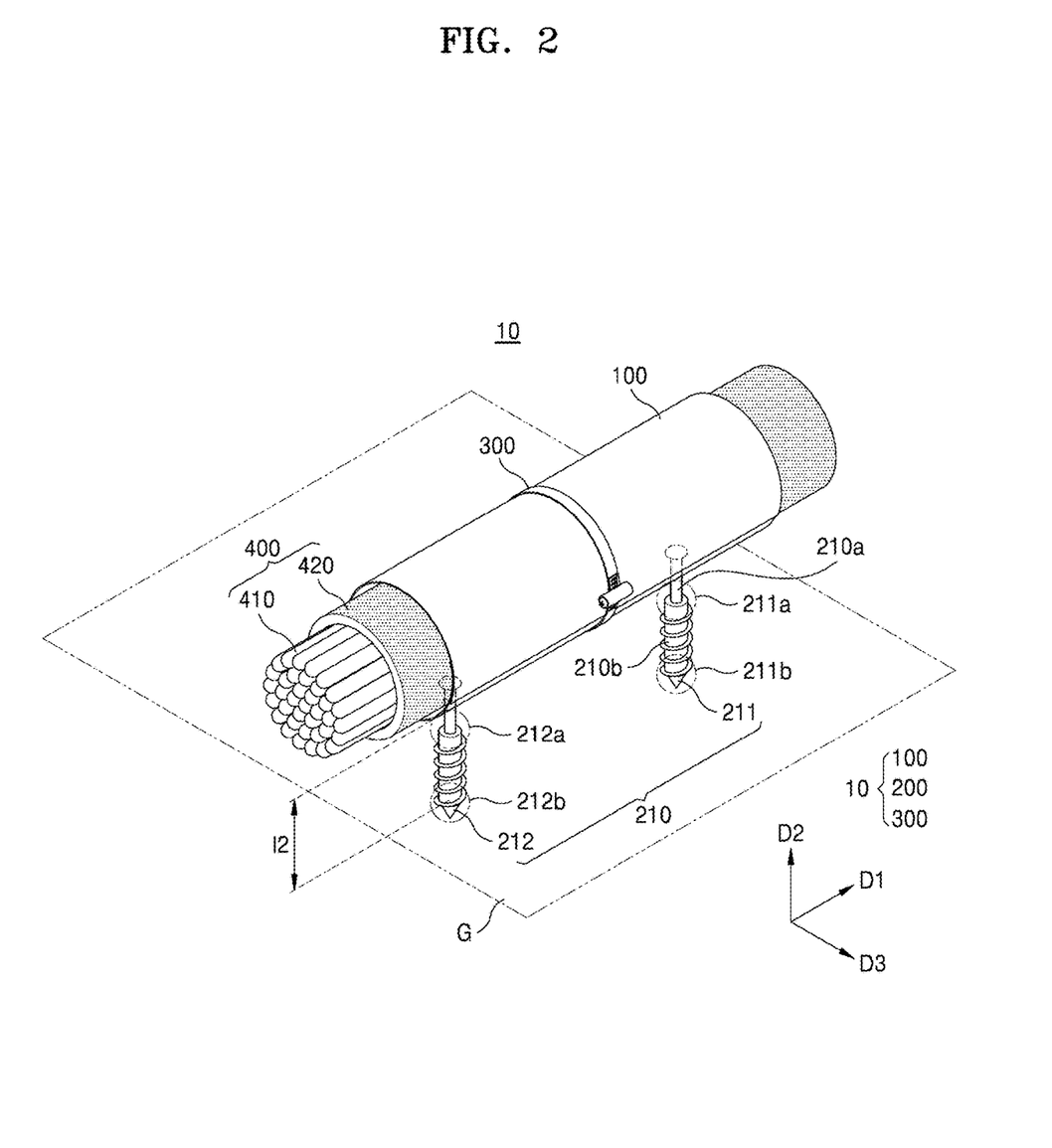
FIG. 2 is a view illustrating a state in which the current filter according to the embodiment of the disclosure is mounted on a cable portion.

Hereinafter, a current filter according to an embodiment of the present disclosure will be described with reference to FIGS. 1 and 2. FIG. 1 is a perspective view illustrating a configuration of a current filter 10 externally coupled with a cable, according to an embodiment of the disclosure. FIG. 2 is a view illustrating a state in which the current filter 10 according to the embodiment of the disclosure is mounted on a cable portion 400.

The current filter 10 according to the embodiment may include a coupling portion 100, a ground portion 200 connected to the coupling portion 100, and a locking device 300.

The coupling portion 100 may be coupled to the cable portion 400 to surround the outside of the cable portion 400 including at least one cable 410. The coupling portion 100 may include a flexible metal, and the shape of the coupling portion 100 may be fluidly deformed so that the coupling portion 100 may be easily coupled or adhered to the cable portion 400. The coupling portion 100 may include a metal having high electrical conductivity, such as copper (Cu) or steel. The coupling portion 100 may have a cylindrical shape having a first length l1 extending in a first direction D1. The longer the first length l1 is, the better the shielding performance may be. However, for example, the first length l1 may be about 0.1 m or more and about 0.6 m or less. However, the shape of the coupling portion 100 is not limited thereto, and the coupling portion 100 may adopt a shape in which metal is tightly intertwined in a lattice net form in the form of a braided shield, or various shapes such as the form of a spiral shield in which a plurality of thin metal copper wires are horizontally wound in one direction other than a grid.

The coupling portion 100 may have a first end E1 on one side in the first direction D1 and a second end E2 on the other side in the first direction D1 based on a center line L0 passing through the center C of gravity of the coupling portion 100, the second end E2 facing the first end E1. The first end E1 is a portion located between the center line L0 and a first reference line L1, and the second end E2 is a portion located between the center line L0 and a second reference line L2.

The ground portion 200 is configured to transmit a current flowing from the outside to the coupling portion 100 to a ground plane G, and may be detachably attached to the coupling portion 100. The ground portion 210 according to an embodiment may include at least two ground rods. As an example, the ground rods may include a first ground rod 211 connected to the first end E1 described above, and a second ground rod 212 located apart from the first ground rod 211 and connected to the second end E2. The first end E1 to which the first ground rod 211 is coupled may be located closer to the first reference line L1 than the center line L0, and the second end E2 to which the second ground rod 212 is coupled may be located closer to the second reference line L2 than the center line L0, and thus, the current filter 10 may be stably fixed on the ground plane G. More specifically, the first ground rod 211 may include a first coupling terminal 211a coupled to the first end E1 of the coupling portion 100, and a first ground terminal 211b connected to the ground plane G. Likewise, the second ground rod 212 may include a second coupling terminal 212a coupled to the second end E2 of the coupling portion 100, and a second ground terminal 212b connected to the ground plane G.

The first and second ground rods 211 and 212 of the ground portion 210 may be detachably attached to the coupling portion 100 through the first coupling terminal 211a and the second coupling terminal 212a, and may transmit a current induced in the coupling portion 100 to the ground plane G through the first ground terminal 211b and the second ground terminal 212b. The first and second ground rods 211 and 212 may each have a second length l2 in a second direction D2. For example, the second length l2 may be about 0.2 m or more and about 0.5 m or less, but may be changed according to soil conditions. When the second length l2 is too large, it may be difficult to install and carry the first and second ground rods 211 and 212.

The current filter 10 according to the embodiment may be installed by driving the ground portion 210 into the ground plane G in the second direction D2. More specifically, referring to FIG. 2, each of the first and second ground rods 211 and 212 of the ground portion 210 may include an inner core 210a and an outer shell 210b surrounding the inner core 210a. The inner core 210a and the outer shell 210b may be separated from the coupling portion 100 to be detachably attached to the coupling portion 100. More specifically, the outer shell 210b may be detachably attached to the coupling portion 100 through the inner core 210a.

The outer shell 210b may have a screw-shaped protrusion on the outside thereof so that it may be firmly driven into the ground. The outer shell 210b may have a cylindrical shape with an empty central portion so that the inner core 210a may be inserted therein, and the inner core 210a may have a cylindrical shape with a solid interior to provide durability, strength, and electrical conductivity of the current filter 10. However, according to an embodiment, the inner core 210a may also have a cylindrical shape with an empty central portion. In order to allow the inner core 210a to enter the inside of the outer shell 210b, a diameter of the inner core 210a on a second cross-section (i.e., D1-D3 plane) perpendicular to the second direction D2 may be less than the diameter of the outer shell 210b on the second cross-section.

A method of installing the current filter 10 according to the embodiment may include the following steps. First, the outer shell 210b of the ground portion 210 may be driven, to a certain depth in the second direction D2, into the ground including the ground plane G. Then, the inner core 210a may be inserted into the inside of the outer shell 210b having at least a portion embedded in the ground in the second direction D2. In this way, in the current filter 10, the coupling portion 100 may be firmly and stably fixed to the ground in the second direction D2 through ground portion 210.

FIGS. 1 and 2 illustrate an example in which the ground portion 200 includes two ground rods 211 and 212. However, the disclosure is not limited thereto and two or more ground rods may be arranged in the same numbers or different numbers in the first end E1 and the second end E2 of the coupling portion 100. The number of ground rods included in the ground portion 200 may be variously changed within a range in which the coupling portion 100 may be easily and stably fixed to the ground plane G.

The ground portion 200 may have various shapes according to the characteristics of the ground plane G, and the ground portion 200 according to another embodiment will be described with reference to FIGS. 4 and 5.

The locking device 300 may be attached to the coupling portion 100 from the outside of the coupling portion 100, and may maintain a state in which the coupling portion 100 surrounds the outside of the cable portion 400. By using the locking device 300, the coupling portion 100 may make a stronger capacitive coupling with the cable portion 400. The locking device 300 may be provided at the center of the coupling portion 100, that is, on a cross-section including the center line L0, to improve the stability of the coupling. Because the coupling portion 100 includes a flexible metal, the coupling portion 100 may be brought into close contact with the cable portion 400 using the locking device 300 to improve a fixing force. The size of the coupling portion 100 when the coupling portion 100 is coupled to the cable portion 400 may be adjusted using the locking device 300. More specifically, a diameter of a first cross-section (D2-D3 plane) taken by cutting the coupling portion 100 in the second direction D2 crossing the first direction D1 may be adjusted through the locking device 300.

The position of the locking device 300 is not limited thereto, and at least one locking device may be provided on each of the first end E1 and the second end E2 of the coupling portion 100. The position of the locking device 300 and the number of locking devices 300 are not limited to the examples shown in FIGS. 1 and 2 and may be variously changed within a range in which a coupling force between the coupling portion 100 and the cable portion 400 may be improved.

Figure 3:
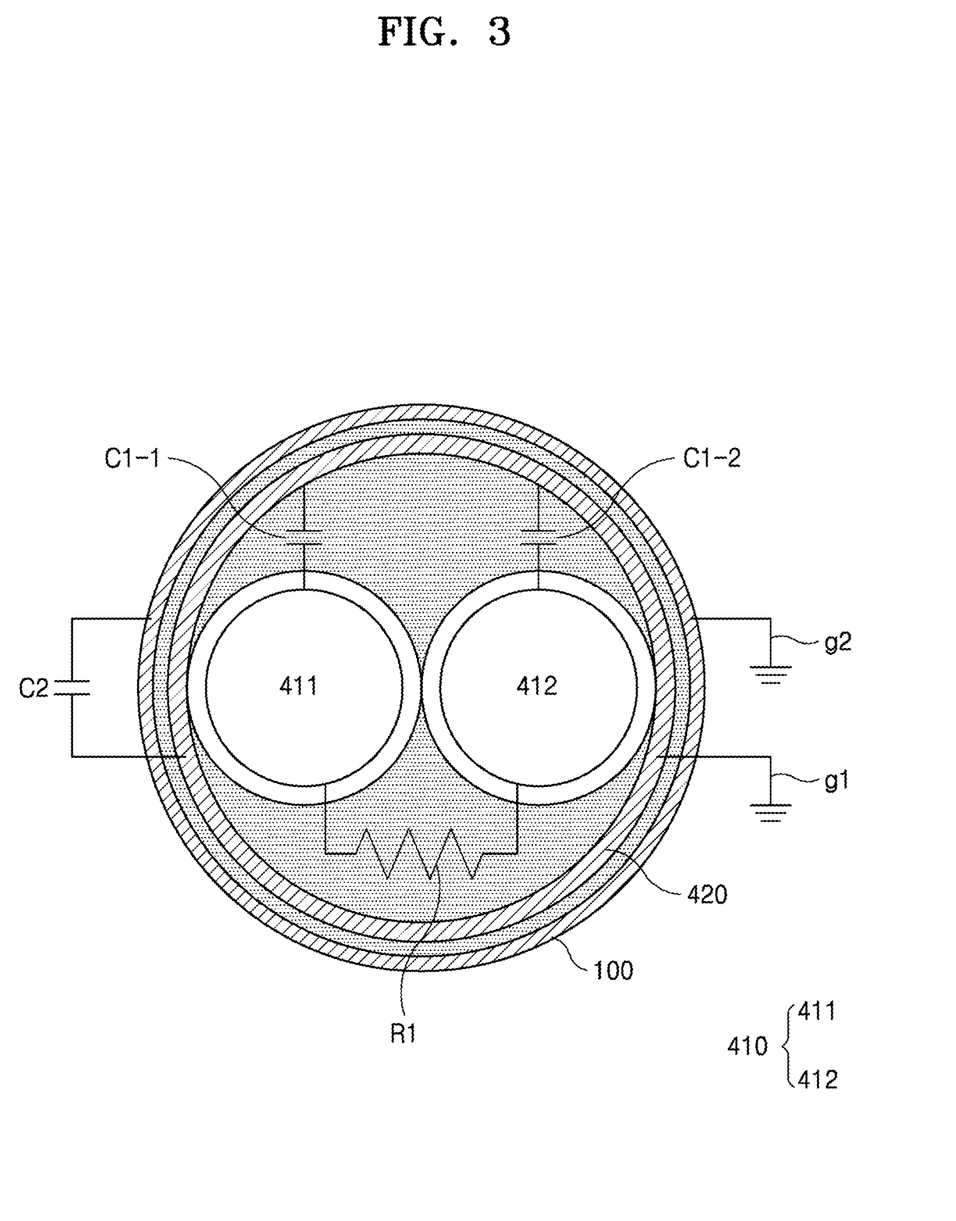
FIG. 3 is a schematic cross-sectional view illustrating a cross-section of a current filter mounted on a cable portion, according to the embodiment of FIG. 2.

FIG. 3 is a schematic cross-sectional view illustrating a cross-section of the current filter 10 mounted on the cable portion 400 according to the embodiment of FIG. 2.

The cable portion 400 may include a transmission line 410 that is a signal transmission line, and a metal shield 420 provided outside the transmission line 410 to surround the transmission line 410. In FIG. 3, only two transmission lines 411 and 412 among a plurality of transmission lines 410 are shown as a representative. Although not shown in FIG. 2, because the end of the cable portion 400 may be connected to a system, this system is indicated as a system resistance R1 connected to the transmission line 410. The transmission line 410 may make a first capacitive coupling with the metal shield 420, and coupling characteristics related to the first capacitive coupling are illustrated as first capacitors C1-1 and C1-2. The metal shield 420 may be grounded (refer to g1) to the ground plane G (refer to FIG. 2), and may be grounded at the end of the cable portion 400.

The coupling portion 100 may be coupled to the cable portion 400 to surround the cable portion 400, in particular, the outside of the metal shield 420. The coupling portion 100 may make a second capacitive coupling with the metal shield 420, and coupling characteristics related to the second capacitive coupling are illustrated as a second capacitor C2. The coupling portion 100 may also be grounded (refer to g2) to the ground plane G.

An external signal induces a current in the coupling portion 100 and accordingly generates a current in the metal shield 420. When the current in the metal shield 420 is transmitted to the transmission line 410 through the first capacitive coupling indicated by the first capacitors C1-1 and C1-2, an external signal affects the transmission line 410. In general, when the external signal is a low frequency signal, very low energy is transmitted to the transmission line 410 due to the characteristics of capacitive coupling. On the other hand, when the external signal is high-frequency signal, a skin effect, in which current intensively flows to the surface of a conductor, occurs, and in this case, because the external signal (or current) may not pass through a skin depth that is a depth where the current flows, very low energy is transmitted to the transmission line 410, as in the case where the external signal is a low-frequency signal. That is, most of the energy caused by the external signal may flow to the ground g1 located at the end of the cable portion 400.

However, when the energy intensity of the external signal is very large, energy of a significant amount may be transmitted to the transmission line 410. In particular, because a high-altitude electromagnetic pulse (HEMP) as an external signal in protection facilities has very strong energy, the role of a current filter that blocks the transmission of the HEMP which has a very strong energy to the transmission line 410 is important. Accordingly, by coupling the current filter 10 according to the embodiment to the cable portion 400, a current flowing through the metal shield 420 may flow to the outside through the coupling portion 100 instead of the transmission line 410, and thus, the influence of an external current on the transmission line 410 may be reduced.

Figure 4:
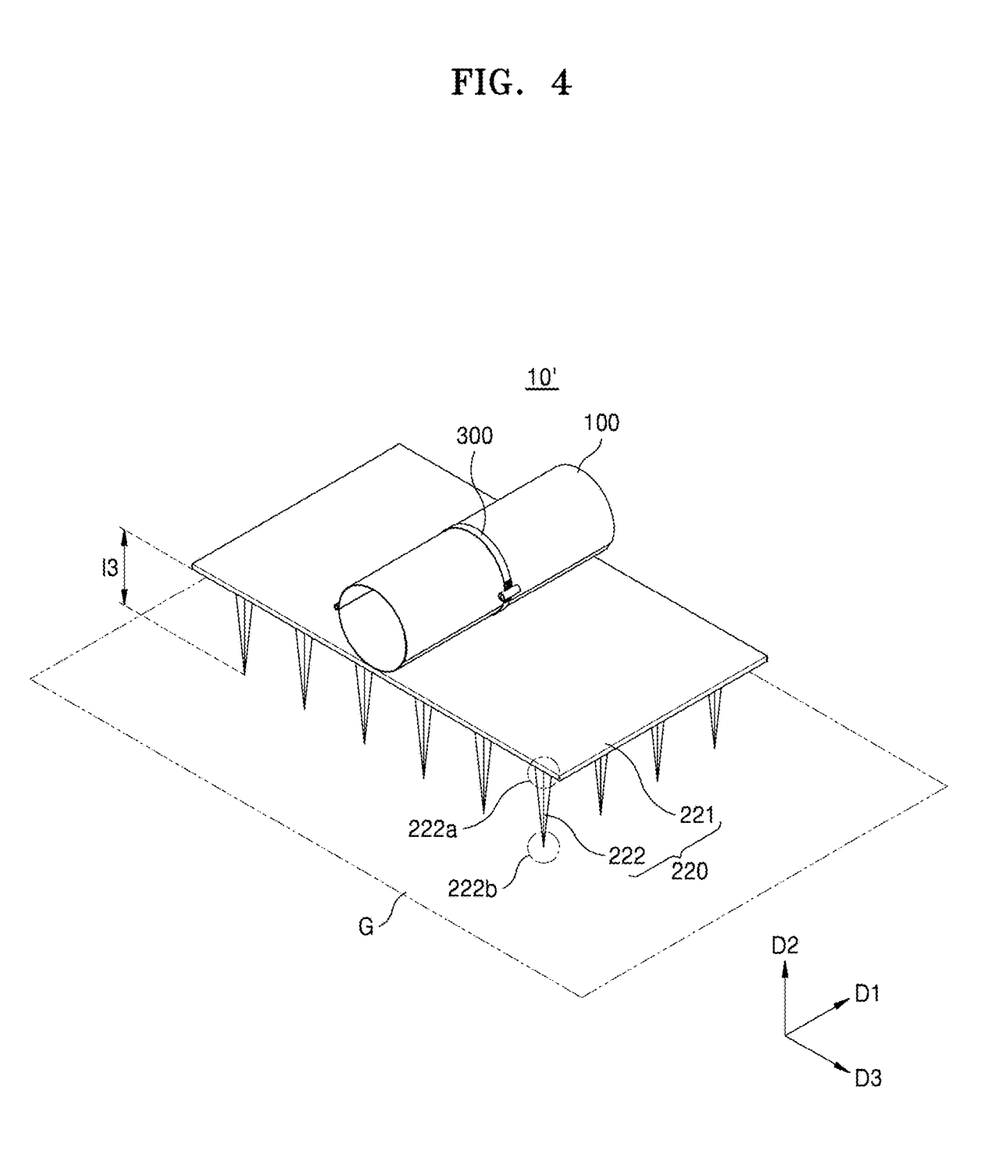
FIG. 4 is a schematic perspective view illustrating a configuration of a current filter according to another embodiment of the disclosure.
Figure 5:
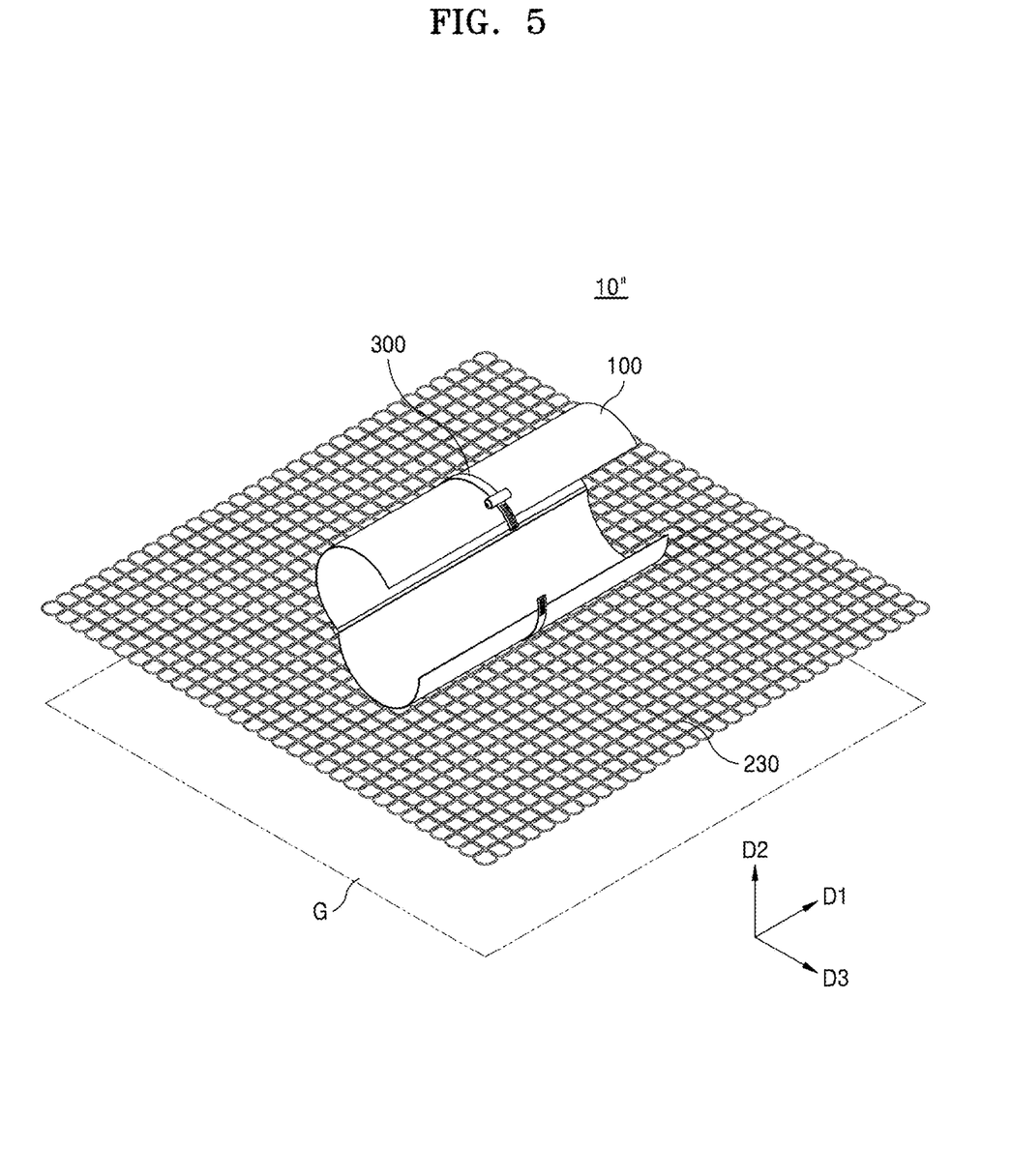
FIG. 5 is a schematic perspective view illustrating a configuration of a current filter according to another embodiment of the disclosure.

FIG. 4 is a schematic perspective view illustrating a configuration of a current filter 10' according to another embodiment of the disclosure. The current filter 10' may include a coupling portion 100, a ground portion 220, and a locking device 300. Hereinafter, a description will be made mainly on the ground portion 220, which is a part distinguished from the above-described embodiment. The ground portion 220 according to the embodiment of FIG. 4 may be used when a ground portion (e.g., the ground rods 211 and 212 described above) may not be deeply installed due to the characteristics of a ground plane G.

The ground portion 220 may include a ground plate 221 in contact with at least a portion of the coupling portion 100 and a plurality of ground pins 222 connected to the ground plate 221. A length l3 of each of the ground pins 222 in a second direction D2 may be, for example, about 0.1 m or more and about 0.3 m or less. Because a greater number of ground pins 222 is used than the number of ground rods 211 and 212 (refer to FIG. 2) described above, the ground pins 22 may be shorter than the ground rods 211 and 212 (i.e., l3<l2), and the ground plate 221 may be provided with a greater number of ground pins 222 than the number of ground rods 211 and 212. In this way, a current flowing through the coupling portion 100 may flow smoothly and quickly to the ground plane G through the ground plate 221 and through the plurality of ground pins 222 that are short. Each of the plurality of ground pins 222 may include a coupling terminal 222a coupled to the ground plate 221 and a ground terminal 222b connected to the ground plane G. The ground portion 220 may be detachably attached to the coupling portion 100 through the coupling terminal 222a, and may transmit a current induced in the coupling portion 100 to the ground plane G through the ground terminal 222b.

The size of the coupling portion 100 when the coupling portion 100 is coupled to the cable portion 400 may be adjusted using the locking device 300. More specifically, a diameter on a first cross-section (D2-D3 plane) taken by cutting the coupling portion 100 in the second direction D2 crossing the first direction D1 may be adjusted through the locking device 300.

Figure 6:
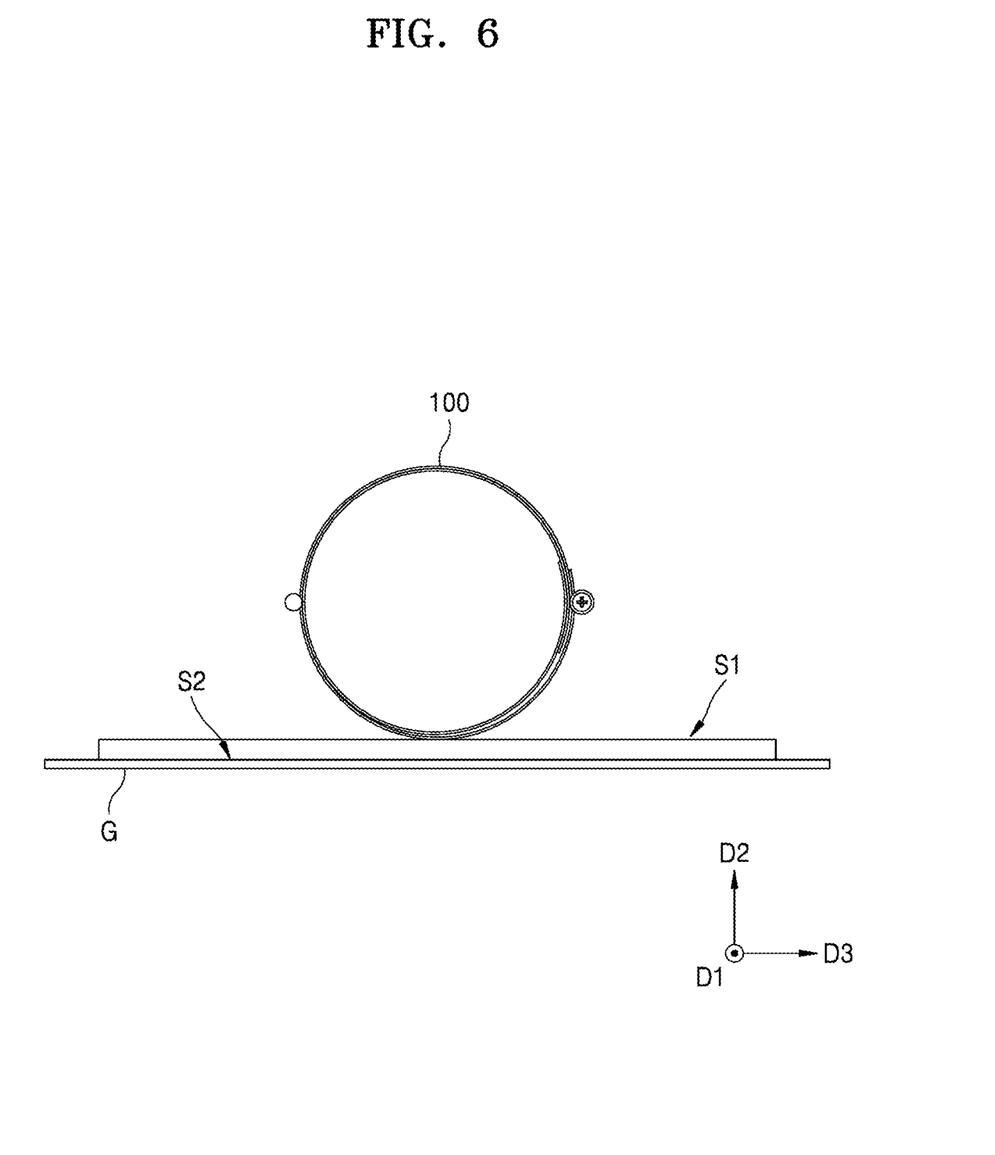
FIG. 6 is a side view of the current filter of FIG. 4 as viewed from one direction.

Hereinafter, a current filter 10" according to another embodiment will be described with reference to FIGS. 5 and 6. FIG. 5 is a schematic perspective view illustrating a configuration of a current filter 10" according to another embodiment of the disclosure, and FIG. 6 is a side view of the current filter 10" as viewed from one direction. The current filter 10" may include a coupling portion 100, a ground portion 230, and a locking device 300. Hereinafter, a description will be made mainly on the ground portion 230, which is a part distinguished from the above-described embodiment. The ground portion 230 according to the present embodiment may be used when a ground portion (e.g., the ground rods 211 and 212 described above) may not be deeply or completely driven due to the characteristics of a ground plane G.

The ground portion 230 may include a ground plate 230 in contact with at least a portion of the coupling portion 100. Hereinafter, in the present embodiment, the ground portion 230 may be referred to as a ground plate 230. Referring to FIG. 6, the ground plate 230 may include a first surface S1 in contact with at least a portion of the coupling portion 100, and a second surface S2 opposite to the first surface S1 and connected to the ground plane G. The ground plate 230 may be detachably attached to the coupling portion 100 through the first surface S1, and may transmit a current induced in the coupling portion 100 to the ground plane G through the second surface S2. In this case, the ground plate 230 may include a mesh type or chain type metal. The ground plate 230 having a net or mesh shape may improve a coupling force with the ground plane G, and may enable a smooth and rapid flow of current flowing from the coupling portion 100 to the ground plane G through the ground plate 230.

As in the above-described embodiments, the size of the coupling portion 100 when the coupling portion 100 is coupled to the cable portion 400 may be adjusted using the locking device 300. More specifically, a diameter on a first cross-section (D2-D3 plane) taken by cutting the coupling portion 100 in the second direction D2 crossing the first direction D1 may be adjusted through the locking device 300.

Figure 7:
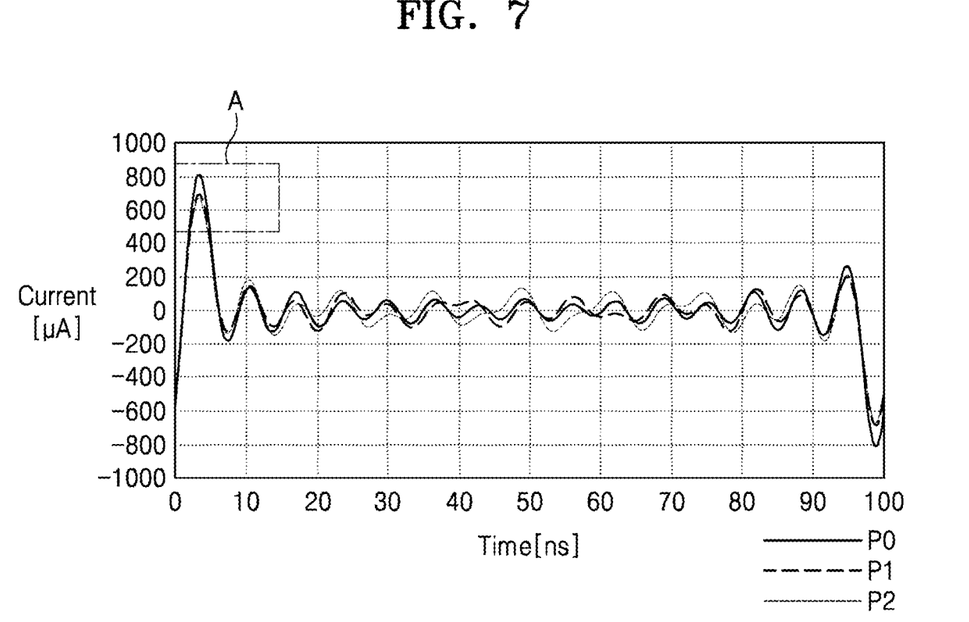
FIG. 7 is a graph showing a change in current for explaining the effect of a current filter, according to an embodiment of the disclosure.
Figure 8:
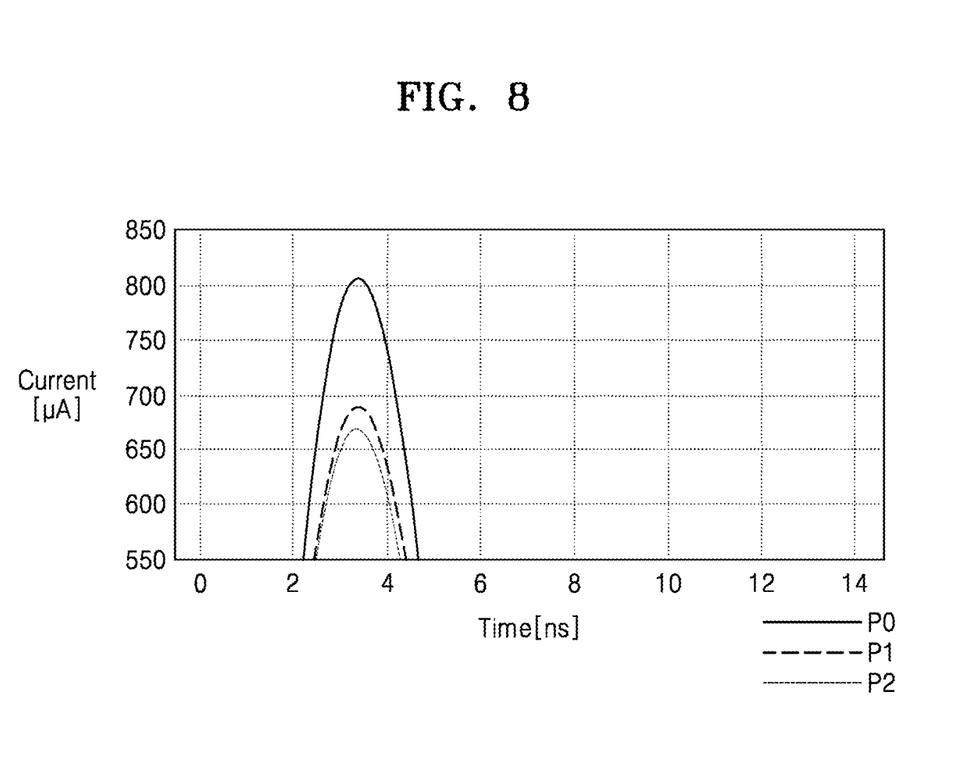
FIG. 8 is a graph which is an enlarged portion of the graph of FIG. 7.

Hereinafter, the effect of the current filter 10 according to the embodiment will be described with reference to FIGS. 7 and 8. FIG. 7 is a graph showing a change in current for explaining the effect of the current filter 10 according to the embodiment of the disclosure, and FIG. 8 is graph that is an enlargement of a portion A of the graph of FIG. 7. In more detail, FIG. 7 is a graph comparing changes in current flowing through the cable portion 400, in a state in which the current filter 10 is coupled to the cable portion 400 and in a state in which the current filter 10 is not connected to the cable portion 400, when the cable portion 400 is exposed to an E1 pulse specified in the MIL-STD-188-125-1 standard which is the very fast component of nuclear EMP. The MIL-STD-188-125-1 standard is a standard applied domestically and internationally to prepare a performance standard and a measurement method for high-power electromagnetic wave protection facilities. The horizontal axis of the graph of each of FIG. 7 and FIG. 8 represents time [ns], the vertical axis of the graph represents the amount of current [μA], and a total of three current profiles, that is, a reference profile P0, a first profile P1, and a second profile P2, are shown in the graph.

The reference profile P0 represents a change in current flowing through the cable portion 400 when the current filter 10 is not coupled to the cable portion 400, the first profile P1 represents a change in current flowing through the cable portion 400 when one current filter 10 is coupled to the cable portion 400, and the second profile P2 represents a change in current flowing through the cable portion 400 when two current filters 10 are coupled to the cable portion 400.

Referring to FIG. 8, a portion A, in which the maximum current flows, on the entire profile of FIG. 7 is enlarged. The reference profile P0, the first profile P1, and the second profile P2 are sequentially shown. Compared to the reference profile P0, the first and second profiles P1 and P2 are located relatively lower, and in the case where the current filter 10 is coupled to the cable portion 400 than in the case where the current filter 10 is not coupled to the cable portion 400, the maximum current flowing through the cable portion 400 is significantly reduced. In other words, it can be seen that the influence of an external signal (i.e., the E1 pulse in the present embodiment) on the cable portion 400, particularly the transmission line 410, is significantly reduced as the current filter 10 is coupled to the cable portion 400.

Also, the second profile P2 is positioned below the first profile P1. That is, it can be seen that as the number of current filters 10 coupled to the cable portion 400 increases, the flow of current to the cable portion 400 is further blocked and accordingly the influence of an external signal on the cable portion 400 decreases.

When comparing maximum current magnitudes in the vicinity of about 3 ns where the maximum current flows, the reference profile P0 has a maximum current of about 800 μA, the first profile P1 has a maximum current of about 690 μA, and the second profile P2 has a maximum current of about 670 μA. When the current filter 10 is coupled to the cable portion 400, the maximum current may be reduced by about 10% or more and about 20% or less.

As described above, according to the current filter 10 according to the embodiment of the disclosure, the influence of current on the transmission line 410 may be reduced by inducing the current induced in the cable portion 400 to flow to the ground plane G by using a single capacitive coupling cylinder, and the capability of protection from an external signal (i.e., EMP (HEMP)) may be improved.

In addition, even though the cable portion 400 was not originally designed for EMP (HEMP) blocking, the current filter 10 according to the embodiment of the disclosure may be simply coupled to the cable portion 400 to flexibly apply the capability of protection from high energy EMP (HEMP) to the cable portion 400. In other words, the current filter 10 may have a simple shape so that it may be immediately applied to a system without EMP (HEMP) protection facilities, and accordingly, the current filter 10 may be conveniently and easily installed in the system and may simplify manufacturing and maintenance.

In addition, the current filter 10 or the cable portion 400 may be firmly and stably fixed on the ground through the ground portion 200.

In addition, by fixing the cable portion 400 on the ground (i.e., the ground plane G) through the current filter 10, in particular, the ground portion 200, vibration of the cable portion 400 may be prevented. Accordingly, errors and defects due to signal disconnection, noise, and cable breakage caused by physical phenomena such as vibration may be reduced, thereby improving the accuracy and efficiency of signal transmission.

According to embodiments of the disclosure, the capability to protect a cable against external signals (EMP, HEMP) may be improved by inducing a current induced in the cable to flow to a ground plane by using a single capacitive coupling cylinder.

In addition, a current filter may have a simple shape so that it may be immediately applied to a system without EMP (HEMP) protection facilities, and accordingly, the current filter may be conveniently and easily installed in the system and may simplify manufacturing and maintenance.

In addition, the current filter or the cable may be firmly and stably fixed on the ground through a ground portion.

In addition, by fixing the cable on the ground (i.e., a ground plane) through the current filter, vibration of the cable may be prevented and accordingly, signal disconnection, noise, and cable breakage caused by physical phenomena such as vibration may be reduced, thereby improving the accuracy and efficiency of signal transmission.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A current filter externally coupled to a cable, the current filter comprising:
   a coupling portion coupled to the cable to surround the cable, the coupling portion including a flexible metal; and
   a ground portion detachably attached to the coupling portion and transmitting a current flowing through the coupling portion to a ground plane,
   wherein
   the coupling portion has a first end on one side and a second end on another side, the second end facing the first end, and
   the ground portion includes at least two ground rods,
   wherein the at least two ground rods include a first ground rod connected to the first end and a second ground rod spaced apart from the first ground rod and connected to the second end.

2. The current filter of claim 1, wherein:
   the cable includes at least one transmission line and a metal shield surrounding the at least one transmission line, and
   the coupling portion forms a capacitive coupling with the metal shield of the cable.

3. The current filter of claim 1, wherein
   the first ground rod includes a first coupling terminal coupled to the first end and a first ground terminal connected to the ground plane, and the second ground rod includes a second coupling terminal coupled to the second end and a second ground terminal connected to the ground plane, wherein the ground portion is detachably attached to the coupling portion through the first coupling terminal and the second coupling terminal, and transmits current induced in the coupling portion to the ground plane through the first ground terminal and the second ground terminal.

4. A current filter externally coupled to a cable, the current filter comprising:

a coupling portion coupled to the cable to surround the cable, the coupling portion including a flexible metal;

a ground portion detachably attached to the coupling portion and transmitting a current flowing through the coupling portion to a ground plane; and a locking device attached to the coupling portion to fix the coupling portion to the cable.

5. The current filter of claim 4, wherein the coupling portion has a cylindrical shape having a length extending in a first direction, wherein a diameter of a first cross-section taken by cutting the coupling portion in a second direction crossing the first direction is adjusted using the locking device.

6. A current filter externally coupled to a cable, the current filter comprising:

a coupling portion coupled to the cable to surround the cable, the coupling portion including a flexible metal; and a ground portion detachably attached to the coupling portion and transmitting a current flowing through the coupling portion to a ground plane, wherein the ground portion includes a ground plate in contact with at least a portion of the coupling portion, and a plurality of ground pins connected to the ground plate.

7. The current filter of claim 6, wherein each of the plurality of ground pins includes a coupling terminal coupled to the ground plate and a ground terminal coupled to the ground plane, wherein the ground portion is detachably attached to the coupling portion through the coupling terminal, and transmits current induced in the coupling portion to the ground plane through the ground terminal.

8. The current filter of claim 6, further comprising a locking device attached to the coupling portion to fix the coupling portion to the cable, wherein a size of the coupling portion when the coupling portion is coupled to the cable is adjusted using the locking device.

9. A current filter externally coupled to a cable, the current filter comprising:

a coupling portion coupled to the cable to surround the cable, the coupling portion including a flexible metal; and a ground portion detachably attached to the coupling portion and transmitting a current flowing through the coupling portion to a ground plane, wherein the ground portion includes a ground plate in contact with at least a portion of the coupling portion, wherein the ground plate has a mesh shape.

10. The current filter of claim 9, wherein the ground plate includes a first surface in contact with at least a portion of the coupling portion, and a second surface opposite to the first surface and connected to the ground plane, wherein the ground portion is detachably attached to the coupling portion through the first surface, and transmits current induced in the coupling portion to the ground plane through the second surface.

11. The current filter of claim 9, further comprising a locking device attached to the coupling portion to fix the coupling portion to the cable, wherein a size of the coupling portion when the coupling portion is coupled to the cable is adjusted using the locking device.

* * * * *